(12) United States Patent
Kameyama et al.

(10) Patent No.: US 7,700,459 B2
(45) Date of Patent: Apr. 20, 2010

(54) METHOD FOR PRODUCING ELECTRONIC DEVICE AND ELECTRONIC DEVICE

(75) Inventors: Masaomi Kameyama, Tokyo (JP); Norio Kaneko, Tokyo (JP); Yusuke Taki, Sagamihara (JP)

(73) Assignee: Nikon Corporation, Tokyo (JP)

( * ) Notice: Subject to any disclaimer, the term of this patent is extended or adjusted under 35 U.S.C. 154(b) by 564 days.

(21) Appl. No.: 11/628,053

(22) PCT Filed: May 31, 2005

(86) PCT No.: PCT/JP2005/009925

§ 371 (c)(1),
(2), (4) Date: Nov. 30, 2006

(87) PCT Pub. No.: WO2005/119789

PCT Pub. Date: Dec. 15, 2005

(65) Prior Publication Data

US 2008/0014675 A1    Jan. 17, 2008

(30) Foreign Application Priority Data

Jun. 1, 2004    (JP)    ............................. 2004-163787

(51) Int. Cl.
*H01L 21/20*    (2006.01)
(52) U.S. Cl. ............................. 438/478; 257/E21.464; 257/E21.475; 257/E51.039
(58) Field of Classification Search .................. 438/478, 438/30, 59, 72
See application file for complete search history.

(56) References Cited

U.S. PATENT DOCUMENTS 6,987,302 B1 * 1/2006 Chen et al. ................... 257/368
2003/0044519 A1 * 3/2003 Takai ........................... 427/77
2003/0111946 A1 * 6/2003 Talin et al. ................... 313/311
2003/0189235 A1   10/2003 Watanabe et al.
2003/0215865 A1 * 11/2003 Mayer et al. .................... 435/6
2004/0023514 A1   2/2004 Moriya et al.
2005/0077527 A1 *  4/2005 Lee ............................. 257/79

FOREIGN PATENT DOCUMENTS

| JP | A-2003-257304 | 9/2003 |
| JP | A-2003-303978 | 10/2003 |
| JP | A-2003-332266 | 11/2003 |
| JP | A-2004-016858 | 1/2004 |
| JP | A-2004-071654 | 3/2004 |

* cited by examiner

*Primary Examiner*—Quoc D Hoang
(74) *Attorney, Agent, or Firm*—Oliff & Berridge, PLC

(57) ABSTRACT

Upon fixing fine particulate active element members, which are carbon nanotube, rod-shaped semiconductor crystal, or the like, in an electronic device at predetermined positions thereof respectively, a method for producing an electronic device includes: dispersing the fine particulate active element members in a dielectric liquid and filling the liquid in a space between a process-objective substrate and a mask which is placed opposite to the substrate and which has predetermined pattern electrodes formed therein; and applying a predetermined voltage to the predetermined electrodes to concentrate the fine particulate active element members at positions which correspond to positions of the pattern electrodes, respectively. In this state, a light is irradiated to the substrate and the fine particulate active element members in the liquid so as to fix the fine particulate active element members to the substrate by a photochemical reaction. Thus, a high-performance electronic device using carbon nanotubes or rod-shaped semiconductor crystal can be manufactured at low cost.

29 Claims, 5 Drawing Sheets

(A)

(B)

(A)

(B)

(C)

(D)

(E)

(F)

METHOD FOR PRODUCING ELECTRONIC DEVICE AND ELECTRONIC DEVICE

TECHNICAL FIELD

The present invention relates to a technique for producing an electronic device including, for example, semiconductor integrated circuits, liquid crystal display devices, EL (electroluminescence) display devices. In particular, the present invention relates to a method for forming an active microelement equipped for the electronic device.

BACKGROUND ART

The electronic device, which includes, for example, semiconductor integrated circuits and liquid crystal display devices, is produced by forming a semiconductor element on a substrate such as glass or semiconductor. The semiconductor material, which is to be used for forming the semiconductor element, is formed as a thin film on a glass substrate or a semiconductor substrate itself. The semiconductor material is finely processed by using the lithography technique, and thus a desired semiconductor element such as a transistor is formed on the substrate.

The semiconductor integrated circuit, which is included in the electronic device, is generally formed by forming a microcircuit on a substrate (wafer) composed of silicon single crystal by using the lithography technique. In order to realize the high integration and the high speed of the integrated circuit, it is effective to microfabricate the circuit pattern in the microcircuit. The fine pattern or the micropattern is formed by using the lithography technique. At present, it is also possible to form a fine pattern having a minimum line width of not more than about 100 nm. Accordingly, a semiconductor integrated circuit, which has an operation frequency of 2 to 3 GHz, is also produced.

In recent years, it is investigated to adopt the carbon nanotube as a material for the active element such as a transistor for constructing the semiconductor integrated circuit. The electrical resistance of the carbon nanotube is smaller than that of silicon. Therefore, it is expected to realize an integrated circuit which has a higher speed and which consumes a smaller amount of electric power, as compared with an integrated circuit constructed of a transistor made of silicon.

On the other hand, the liquid crystal display device, for which the light transmittance is required, is formed on a light-transmissive substrate such as a glass substrate. The material for the transistor for controlling the brightness/darkness of the display element is a thin film semiconductor such as amorphous silicon which is uniformly formed as a film on a glass substrate. Portions of the film, other than predetermined portions thereof, are selectively exfoliated by using the lithography technique. The thin film semiconductor, which exists at the remaining portions, is processed as the transistor. After performing the steps as described above, the liquid crystal display device is produced.

The high degree of integration and the high speed operation performance, which are required to such an extent that the semiconductor integrated circuit requires, are not required for the liquid crystal display device. Therefore, no problem arises in relation to the performance including, for example, the high speed operation performance even in the case of the device constructed of the thin film semiconductor based on the use of amorphous silicon. However, in order to form the amorphous silicon on the glass substrate, the following condition is required for the glass substrate to construct the liquid crystal device. That is, it is necessary to use relatively expensive glass which endures a high temperature of about 700° C. during the film formation of amorphous silicon.

In view of the above, it has been suggested that a transistor for the liquid crystal display device is formed by arranging, for example, semiconductor crystal at a predetermined position on the glass substrate, the semiconductor crystal being previously formed at any place other than those on the glass substrate, rather than forming the film of semiconductor on the glass substrate. In this procedure, for example, a fine particulate powder of rod-shaped semiconductor crystal, which has a diameter ranging from about 100 nm to about several µm and which has a length of about several tens of µm, is formed at any place other than those on the glass substrate. The fine particulate powder is arranged while providing predetermined orientation to the fine particulate powder at a predetermined position on the glass substrate, which is used to form a transistor for controlling the display element. An idea is suggested in Non-patent Document 1 in which a fine particulate powder of semiconductor crystal is arranged at a predetermined position on a glass substrate while providing predetermined orientation to the fine particulate powder.

Non-Patent Document 1: a document known on the internet (http://www.nanosysinc.com/technology.html)

DISCLOSURE OF THE INVENTION

Problem to be Solved by the Invention:

Non-patent Document 1 does not disclose any specified technique for arranging the fine particulate powder of semiconductor crystal at a predetermined position on the glass substrate while providing the predetermined orientation to the fine particulate powder. It is noted that the carbon nanotube and the rod-shaped semiconductor crystal basically have no orientation. For this reason, it has been difficult to arrange the fine particulate active element member at any predetermined position with predetermined orientation (directionality) in the method for producing the integrated circuit using the carbon nanotube as well as in the method for producing the display device using the rod-shaped fine particle semiconductor crystal.

The present invention has been made taking the foregoing problems into consideration, a first object of which is to provide a method for producing an electronic device which makes it possible to arrange an active element member while providing predetermined orientation, to the active element member, at least at one predetermined position on a process-objective substrate when the electronic device is produced.

A second object of the present invention is to successfully provide a high performance electronic device by using the production technique at low cost.

Means for Solving the Problem:

An explanation will be made below about a method for producing an electronic device according to the present invention with reference to symbols and reference numerals depicted in the drawings. However, the feature of the present invention is not limited to embodiments illustrated in the drawings as well as those including the constitutive elements corresponding to the concerning symbols and reference numerals.

According to the present invention, there is provided a method for producing an electronic device; comprising a step for placing a mask, having at least one predetermined electrode formed thereon, closely to an process-objective substrate on which the electronic device is to be formed; a step for filling a space between the process-objective substrate and the mask with a dielectric liquid containing a fine particulate active element member; a step for applying a predetermined voltage to the predetermined electrode; and a step for fixing the active element member contained in the liquid to the process-objective substrate.

In the present invention, the fine particulate active element member, which is scattered or dispersed in the liquid, can be arranged at a predetermined position while providing predetermined directionality to the fine particulate active member, depending on the shape of the electrode by the action of the electric field formed by the electrode formed on the mask. The fine particulate active element member is fixed onto the process-objective substrate in the state of being arranged. Accordingly, the fine particulate active element member can be fixed at the predetermined position in the predetermined direction.

The method for producing the electronic device according to the present invention may further comprise a step for converting the active element member into a transistor. In the present invention, the active element member may be formed of a fine particulate rod-shaped active element material.

In the present invention, the active element member may further include an insulating material which surrounds the fine particulate rod-shaped active element material. In an exemplary procedure of the present invention, the active element material may include a carbon nanotube. Accordingly, for example, it is possible to realize a semiconductor integrated circuit which is operated at a high speed and which consumes a small amount of electric power, by making the use of the low resistance characteristic of the carbon nanotube.

In an exemplary procedure of the present invention, the active element material may include a fine particulate rod-shaped semiconductor. Accordingly, it is possible to use the substrate which is cheap as compared with any conventional method in which a semiconductor active element material is formed on a substrate. It is possible to produce the electronic device at low cost.

The active element member may have a photoreactive substance on an outer circumference thereof. The process-objective substrate may have a photoreactive substance on a surface thereof In this case, it is possible to use, as the photoreactive substance, a substance which includes any one of carboxyl group, sulfo group, hydroxyl group, and fluorine.

The step for fixing the active element member contained in the liquid to the process-objective substrate may include radiating a light beam onto the dielectric liquid and the process-objective substrate. That is, when the photoreactive substance is provided on the outer circumference of the active element member or on the surface of the process-objective substrate, the active element member and the surface of the process-objective substrate can be chemically fixed (secured) to one another strongly by the photochemical reaction caused by the radiation of the light beam.

In an exemplary procedure of the present invention, the electrode formed on the mask may be a composite electrode constructed of a positive electrode which applies a positive electric potential and a negative electrode which applies a negative electric potential, the positive electrode and the negative electrode being arranged adjacently. The composite electrode may be constructed of a first electrode which applies a first electric potential and which extends in one direction, and a second electrode which is arranged in parallel to the first electrode on both sides of the first electrode and which applies a second electric potential having a polarity opposite to that of the first electric potential.

In this case, the electric field, which is directed from the first electrode to the second electrode disposed on the both sides of the first electrode, is formed between the first and second electrodes. In this situation, the intensity of the electric field is weak in the process-objective substrate at a portion thereof opposite to or facing the first electrode. Therefore, the active element member, which is scattered in the liquid, is concentrated at this portion of the process-objective substrate. Accordingly, the active element member can be selectively concentrated or accumulated at the portion of the process-objective substrate opposed to the first electrode.

The electric potential, which is applied to the composite electrode, may be an AC electric potential as well. In an exemplary procedure of the present invention, the electrode formed on the mask may be a transparent electrode which is transparent with respect to the light beam used in the step for fixing the active element member to the process-objective substrate.

Accordingly, when the active element member and the surface of the process-objective substrate are chemically fixed to one another by utilizing the photochemical reaction caused by the radiation of the light beam, the light beam is easily radiated onto the portion, of the substrate, opposite to the electrode as well. It is possible to efficiently cause the photochemical reaction.

In this procedure, the transparent electrode may be formed of one of metal oxide and metal nitride. Accordingly, even when the light beam to be radiated is a light beam having a short wavelength such as the ultraviolet light, it is possible to allow the electrode to possess the sufficient light transmittance.

Alternatively, the transparent electrode may be formed of a diamond film. In an exemplary procedure of the present invention, the dielectric liquid may contain water as a main component thereof. Accordingly, the high dielectric constant, which is the feature of water, can be utilized to more efficiently arrange the active element member at the predetermined position by the function of the electric field formed by the electrode on the mask.

According to the present invention, there is provided an electronic device produced by using the method for producing the electronic device of the present invention as described above. Accordingly, the high performance device is realized at low cost.

Effect of the Invention:

According to the present invention, the fine particulate active element member, which includes, for example, the carbon nanotube and the fine particulate powder of semiconductor crystal, can be arranged at the predetermined position on the process-objective substrate while being provided with the predetermined directionality. That is, the fine particulate active element member can be arranged at the predetermined position in the electronic device while being provided with the predetermined directionality. Therefore, the fine particulate active element member can be applied to the electronic device, although it has been hitherto difficult to apply the fine particulate active element member to the electronic device because of the difficulty in the control of position and direction thereof.

In particular, according to the invention included in the present invention in which the member including the carbon nanotube is used as the fine particulate active element member, it is possible to realize an integrated circuit which has a higher speed and which consumes a smaller amount of electric power as compared with any conventional integrated circuit constructed of the transistor made of silicon, owing to the low electrical resistance characteristic of the carbon nanotube.

In particular, according to the feature of the present invention in which the member including the fine particulate powder of semiconductor crystal or the like is used as the fine particulate active element member, it is possible to produce, for example, a display device without requiring any expensive transparent substrate hiving high heat resistance having been hitherto required for the display device such as the liquid crystal display device. Accordingly, it is possible to reduce the production cost of the display device, and it is possible to provide the high performance display device at low cost.

The feature, of the present invention, which is based on the use of the member including the fine particulate powder of semiconductor crystal or the like, can be also used to produce a semiconductor integrated circuit. Accordingly, it is possible to provide the high performance semiconductor integrated circuit at low cost by using the active element composed of the fine particulate powder of semiconductor crystal, without using any expensive semiconductor crystal substrate.

BRIEF DESCRIPTION OF THE DRAWINGS

FIG. 5 shows magnified sectional views illustrating active element members AE1 to AE3 and the dielectric liquid 12 arranged between the mask 1 and the process-objective substrate 20 shown in FIG. 4 as disposed in the vicinity of the electrode pattern P1 (for example, P1C), wherein FIG. 5(A) shows a state in which no electric potential is applied, for example, to the electrode pattern P1C, and FIG. 5(B) shows a state in which the electric potential is applied, for example, to the electrode pattern P1C.

FIGS. 7(A) to 7(F) show process steps to explain the steps of producing the electronic device according to the present invention in a certain order, wherein FIGS. 7(A) to 7(F) show magnified top views of the process-objective substrate 20 respectively.

FIGS. 8(A) to 8(F) show process steps to explain the steps of producing the electronic device according to the present invention in the certain order corresponding to FIGS. 7(A) to 7(F), wherein FIGS. 8(A) to 8(F) show magnified sectional views of the process-objective substrate 20 respectively.

BEST MODE FOR CARRYING OUT THE INVENTION

Figure 1:
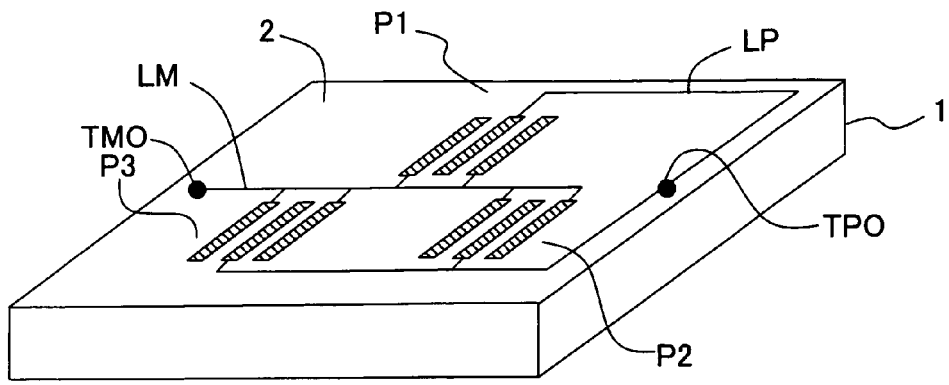
FIG. 1 shows a mask 1 provided with electrode patterns P1 to P3 preferably usable for the method for producing the display device according to the present invention.

An explanation will be made below with reference to the drawings about preferred embodiments of the present invention by way of example. FIG. 1 shows an electrode-equipped or electrode-provided mask to be used in this embodiment. Pattern electrodes P1, P2, P3, which are composed of electrodes having predetermined shapes, are formed at desired positions on a pattern surface 2 of a mask substrate 1 made of a hard transparent material such as a quartz substrate having a small coefficient of thermal expansion (coefficient of linear expansion).

Figure 2:
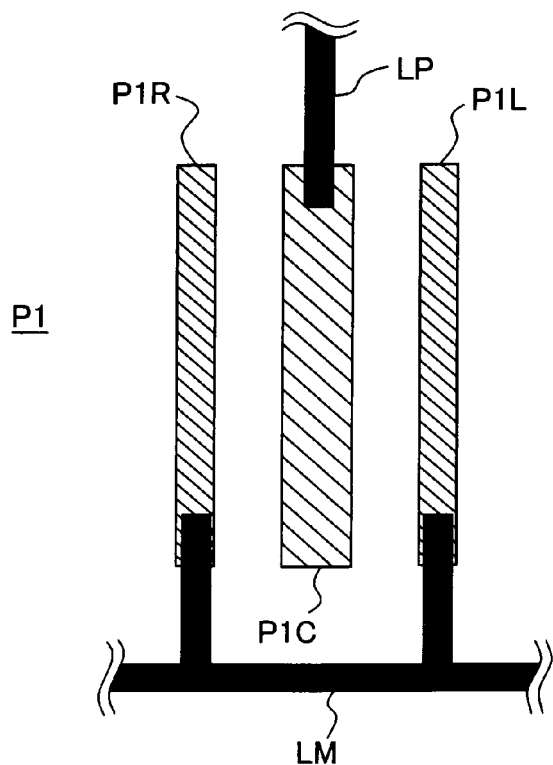
FIG. 2 shows a magnified view of the electrode pattern P1 formed on the mask 1 shown in FIG. 1.
Figure 3:
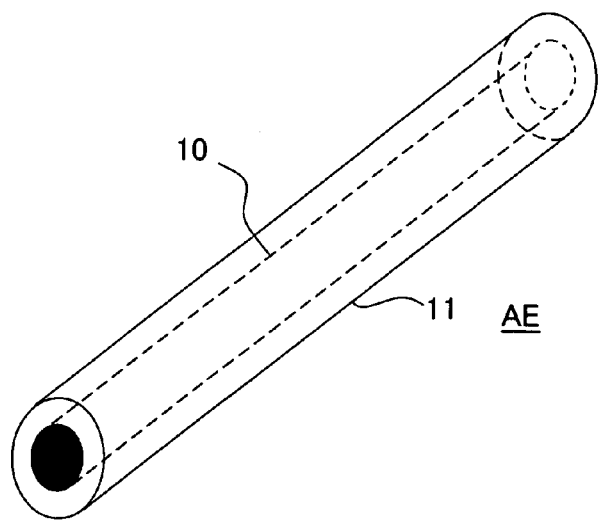
FIG. 3 shows an example of a fine particulate active element member AE preferably usable for the method for producing the display device according to the present invention.

In particular, FIG. 2 shows the pattern electrode P1 in a magnified view. The pattern electrode P1 includes both-side electrodes (second electrode) P1R, P1L which are formed on the both left and right sides about the center of a central electrode (first electrode) P1C which extends in the vertical direction in FIG. 2. A positive electrode wiring LP, which is formed on the pattern surface 2 of the mask 1, is connected to the central electrode P1C. On the other hand, a negative electrode wiring LM, which is formed on the pattern surface 2, is connected to the both-side electrodes P1R, P1L. As shown in FIG. 1, the positive electrode wiring LP and the negative electrode wiring LM are wired and electrically connected to connection terminals TP0, TM0, respectively, formed on the pattern surface 2.

FIG. 2 shows only the magnified view of the pattern electrode P1. However, details of the other pattern electrodes P2, P3 are the same as or equivalent to those of the pattern electrode P1 shown in FIG. 2. Only the three pattern electrodes P1 to P3 are shown on the pattern surface 2 of the mask 1 for the purpose of simplification. However, it goes without saying that a number of tens of thousands to hundreds of millions of pattern electrodes are formed on an actual mask for producing the electronic device.

Next, an explanation will be made about a fine particulate active element member AE to be used in the present invention. The central portion of the fine particulate active element member AE is composed of carbon nanotube or rod-shaped semiconductor crystal as an active element material 10. The fine particulate active element member AE to be used is coated with an insulative thin film 11 provided on the circumference thereof, if necessary.

When the semiconductor crystal is used as the active element material 10, for example, rod-shaped silicon single crystal is used as the semiconductor crystal. The diameter of the rod-shaped silicon single crystal is, for example, from about 10 nm to about 10 μm, and the length thereof is, for example, from about 100 nm to about several 10 μm. As for these conditions, optimum values are selected depending on the condition of the electronic device to which the active element material 10 is applied, i.e., depending on the operation speed and the required amount of current.

In this procedure, for example, it is preferable to use a material such as silicon dioxide or silicon nitride which has a satisfactory bonding property with respect to silicon, as the insulative thin film 11 to surround the active element material 10. It is also possible to use another semiconductor crystal such as gallium arsenide or indium phosphide as the active element material 10.

When the active element material 10 is the carbon nanotube, a thin film of hydrocarbon or hydrocarbon including one of chlorine and fluorine is used as the surrounding insulative thin film 11. In this case, it is desirable that the thin film is chemically bonded at least partially to the carbon atoms constructing the carbon nanotube.

A predetermined functional group is bonded beforehand to the circumference of the active element member AE (to the circumference of the insulating film when the insulating film is formed as described above), if necessary. As for the functional group, for example, it is possible to use at least one of carboxyl group, sulfo group, hydroxyl group, and fluorine.

When the active element material 10 is formed of the carbon nanotube, the member can be formed such that the functional group as described above is directly bonded to the thin film of hydrocarbon or hydrocarbon including one of chlorine and fluorine as the material for the insulative thin film 11 provided therearound.

Even when the insulative thin film 11 is not used, the member can be formed such that the functional group is bonded to at least a part of the carbon atoms constructing the carbon nanotube as the active element material 10. Alternatively, the member can be formed such that the functional group is selectively bonded to defective portions of the bonding between the carbon atoms in the carbon nanotube.

When the active element material 10 is the semiconductor crystal, the member can be formed such that the functional group is directly bonded to the thin film of silicon dioxide as the material for the insulative thin film 11 provided around the active element material 10, or the functional group is bonded by the aid of a silane compound. Even when the insulative thin film 11 is not formed, the member can be formed such that the functional group is directly bonded to the surface of the semiconductor such as silicon, or the functional group is bonded by the aid of a silane compound.

The active element member AE as described above is produced by any known production method. The active element member AE is mixed into water (pure water) or an aqueous solution obtained by dissolving a nonionic substance (hereinafter referred to as "dielectric liquid"). The concentration of the active element member AE in the dielectric liquid greatly differs depending on the type of the electronic device to be produced and the size of the active element member AE itself, which ranges from a ratio of about one in a cube having one side of several 10 nm to a ratio of about one in a cube having one side of several hundreds μm.

Figure 4:
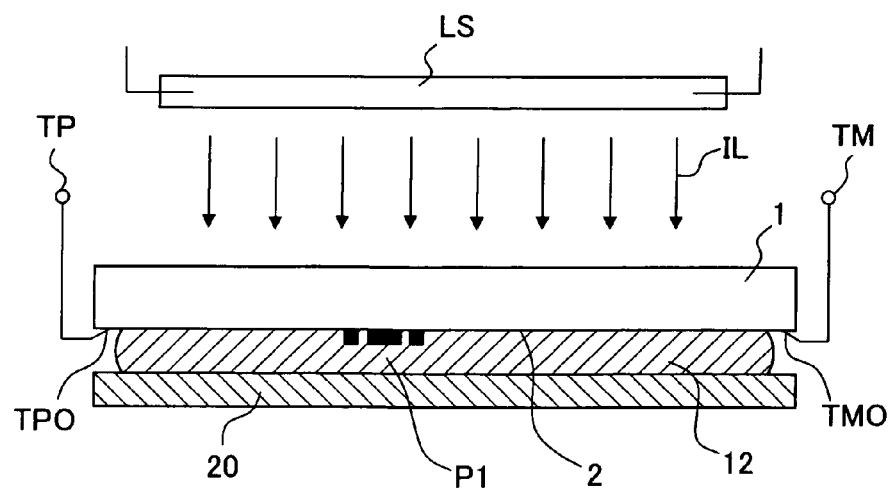
FIG. 4 shows a state in which the mask 1 is arranged opposite to a process-objective substrate 20, and a gap therebetween is filled with a dielectric liquid 12.

Subsequently, as shown in FIG. 4, the pattern surface 2 of the mask 1 is arranged opposite to or facing the process-objective substrate 20 on which the electronic device is to be produced. The gap between the pattern surface 2 of the mask 1 and the process-objective substrate 20 is filled with the dielectric liquid 12 in which the active element members AE are scattered. As for the opposing arrangement, the mask 1 and the process-objective substrate 20 can be also opposed closely to each other in the liquid of the dielectric liquid 12. Alternatively, the following procedure can also be adopted. That is, the dielectric liquid 12 is flowed into the space between the mask 1 and the process-objective substrate 20 which are arranged closely to each other to some extent in the atmospheric air, and then the mask 1 and the process-objective substrate 20 are allowed to make approach closely to each other up to at a predetermined spacing distance.

The positive electrode TP and the negative electrode TM are connected to the connection terminals TP0, TM0, on the pattern surface 2 of the mask 1, respectively. Accordingly, a predetermined electric potential is applied to the pattern electrodes P1 to P3 formed on the pattern surface 2 of the mask 1.

Figure 5:
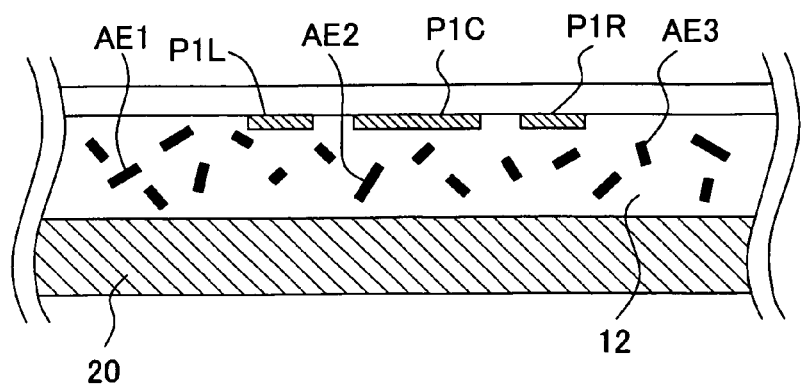
Figure 5:
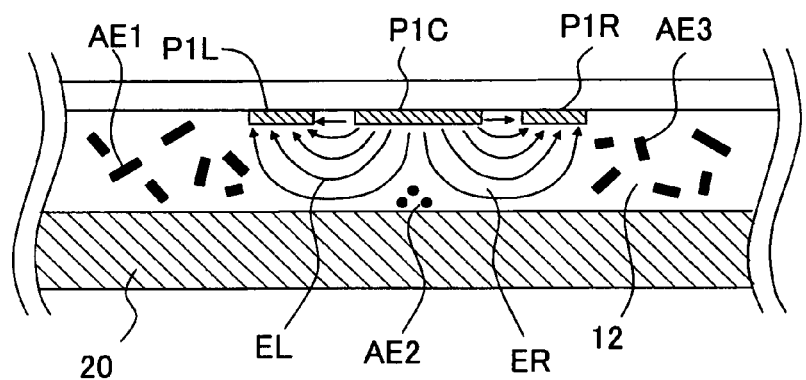

FIG. 5 shows the action to be brought about when the electric potential is applied to the pattern electrode P1 as described above. FIG. 5(A) shows a state before the electric potential is applied to the pattern electrode P1 in relation to the active element members AE1, AE2, AE3 contained in the dielectric liquid 12 present or filled in the gap between the mask 1 and the process-objective substrate 20. The active element members AE1 to AE3 originally or basically have no orientation. Therefore, the active element members AE1 to AE3, which are contained in the dielectric liquid 12, are distributed uniformly and randomly in arbitrary directions at arbitrary positions before the application of the electric potential.

On the contrary, FIG. 5(B) shows a state in which the positive electric potential is applied to the central electrode (first electrode) P1C included in the pattern electrode P1, and the negative electric potential is applied to the both-side electrodes (second electrode) P1L, P1R. In this situation, the electric fields EL, ER are formed in the directions directed from the central electrode P1C to the both-side electrodes P1L, P1R, respectively, in the dielectric liquid 12.

It is now assumed that the dielectric liquid 12 is a liquid containing water as a main component thereof. The specific dielectric constant thereof is about 80, which is greater than the specific dielectric constants (about 12 to 20) of silicon and glass as the process-objective substrate 20. Therefore, the electric fields EL, ER are formed in the dielectric liquid 12 as shown in FIG. 5(B) without being affected by the process-objective substrate 20 so much, i.e., without making, for example, any inflow or infiltration into the process-objective substrate 20. As a result, the intensities of the formed electric fields EL, ER are weak at a portion, on the process-objective substrate 20, opposite to the central electrode (first electrode) P1C.

The specific dielectric constant of the fine particulate active element member AE is about 2 to 3 in the case of the carbon nanotube, or the specific dielectric constant is 12 in the case of fine silicon crystal. In any case, the specific dielectric constant of the fine particulate active element member AE is smaller than the specific dielectric constant of water. Therefore, the following effect is provided in one viewpoint. That is, the fine particulate active element members AE are stable in view of the energy when they exist at the portion at which the electric fields EL, ER are weak as compared with when they exist at the portion at which the electric fields EL, ER are strong. The active element members AE2 are accumulated at the portion, on the process-objective substrate 20, opposite to the central electrode P1C as described above, as if they are expelled by the electric fields EL, ER.

When the active element members AE2 have the slender rod-shaped forms, it is necessary that all of the active element members AE2 are subsumed in the portion at which the electric fields EL, ER are weak as described above, in order that the rod-shaped active element members AE are most stable in view of the energy. As a result, the active element members AE2 are oriented in parallel to the central electrode P1C, and they are arranged on the process-objective substrate 20 so as to be opposite to the central electrode P1C.

At this time, the electric potential, which is applied between the central electrode P1C and the both-side electrodes P1L, P1R, may be an AC electric potential. In this case, minute stimulation can be applied, at every timing at which the sign of the electric potential is inverted, to the active element members AE2 which stay in a metastable stable (position and direction) in view of the energy. It is possible to facilitate the movement to the most stable state as described above. The electric potential, which is applied between the central electrode P1C and the both-side electrodes P1L, P1R, may be also an AC electric potential to which the so-called DC offset is applied, wherein the AC electric potential is added to a predetermined bias electric potential.

As shown in FIG. 4, the light beam is radiated onto the mask 1, the process-objective substrate 20, and the dielectric liquid 12 in this state by using a light source LS such as a mercury lamp. As described above, when the predetermined functional group is bonded to the circumference of the active element member AE2, the active element member AE2 and the process-objective substrate 20 are chemically bonded to one another by the photoreaction of the functional group caused by the light irradiation.

For example, when the carboxyl group is used as the functional group, the carboxyl group provided on the active element member AE2 and the hydroxyl group generally existing on the process-objective substrate 20 form the ester bond by the photochemical reaction to form the chemical bond. Such a process also proceeds equivalently when the sulfo group is used as the functional group.

In order to efficiently perform the fixation of the active element member AE2 onto the process-objective substrate 20 by the photochemical reaction as described above, it is desirable that the functional group preferred or suitable for the photochemical reaction is also bonded to the process-objective substrate 20. When the electronic device is produced, the surface of the process-objective substrate 20 is glass containing, as a main component thereof, silicon dioxide, silicon dioxide, or silicon in many cases. Therefore, the functional group can be bonded thereto by the same or equivalent method as that described above.

In order to cause the photochemical reaction as described above efficiently, it is preferable that the light beam to be radiated is the ultraviolet light having a higher energy. The photochemical reaction between the active element member AE2 and the process-objective substrate 20 is caused in the area disposed just under the central electrode P1C of the pattern electrode P1 (an area, on the process-objective substrate 20, opposite to or facing the central electrode P1C). Therefore, when the central electrode P1C is a light-shielding electrode, it is feared that a greater or substantial part of the light to be radiated onto the area may be shielded, and the efficiency of the photochemical reaction may be lowered.

Accordingly, when the central electrode P1C and the both-side electrodes P1L, P1R are electrodes which are transparent with respect to the radiation light beam, it is possible to avoid the decrease in the efficiency of the photochemical reaction. In this case, it is desirable that the transparent electrode is formed of a material which is satisfactory in the transmittance with respect to the ultraviolet light, including, for example, metal oxide such as magnesium oxide and stannum oxide and metal nitride such as aluminum nitride. Alternatively, a diamond thin film can be also used as the transparent electrode. When the process-objective substrate 20 is transparent, the light beam can be radiated from the side of the process-objective substrate 20. In this case, no problem arises at all even when the central electrode P1C or the both-side electrodes P1L, P1R are electrodes formed of any opaque material. The means for facilitating the fixation of the active element member AE2 onto the process-objective substrate 20 is not limited to the photochemical reaction described above. In place of the light irradiation, for example, any energy ray such as a microwave may be radiated to a part or all of the dielectric liquid 12 and the process-objective substrate 20 to excite the predetermined functional group by the microwave so that the chemical reaction is caused to effect the fixation.

In the procedure described above, the main component of the dielectric liquid 12 is water. However, it goes without saying that any liquid containing a main component other than water can be also used as the dielectric liquid 12 provided that the liquid has a high specific dielectric constant and the liquid is transparent with respect to the ultraviolet light. Therefore, for example, it is also possible to use an organic solvent in which the transmittance with respect to the ultraviolet light is improved by containing fluorine and the specific dielectric constant is increased.

When any existing circuit pattern is present on the process-objective substrate 20, and it is necessary that the active element member AE is formed according to the present invention while making the positional adjustment with respect to the pattern, then the following procedure is desirably adopted. That is, a mark for the positional adjustment is formed beforehand on the mask 1, and an unillustrated microscope or the like is used to perform the positional adjustment with respect to the mark for the positional adjustment or the existing circuit pattern on the process-objective substrate 20. The light is radiated, after performing the positional adjustment, to fix the active element member AE2 at a predetermined position on the process-objective substrate 20.

Any electric field to move the active element member AE is not formed at any portion other than those in the vicinity of the pattern electrode P1. Therefore, the active element members AE1, AE3, which exist at positions other than those in the vicinity of the pattern electrode P1, are not affected by the electric fields formed by the pattern electrode P1, and the active element members AE1 and AE3 continuously float in the dielectric liquid 12 while maintaining arbitrary positions and arbitrary directionalities. Therefore, even when the light irradiation is performed as described above, the active element members AE1, AE3, which float in such portions, respectively, are not fixed onto the process-objective substrate 20.

After the completion of the fixation, the mask 1 is removed from the position opposite to the process-objective substrate 20, and the process-objective substrate 20 is washed with a washing liquid such as pure water by using an unillustrated washing unit. As a result of the washing, the active element members AE1, AE3, which remain in the dielectric liquid 12 without being fixed to the process-objective substrate 20, are removed without remaining on the process-objective substrate 20. On the other hand, the active element members AE2, which are fixed to the process-objective substrate 20, are not removed by the washing, and they continuously remain on the process-objective substrate 20 even after the washing step.

It is not necessarily indispensable that the washing is performed by using any exclusive washing unit. The apparatus, which performs the light irradiation while opposing the process-objective substrate 20 and the mask 1, if necessary, may be also provided with the washing function. Further, the washing liquid is not limited to pure water. Any washing liquid can be used provided that the washing liquid cuts the bonding which fixes, for example, the active element members AE2 to the process-objective substrate 20. After the washing, the process-objective substrate 20 is heated, for example, to about 50° C. to 100° C. to dry the washing liquid. After the washing with the washing liquid as described above, the process-objective substrate 20 may be rinsed with a liquid such as IPA (isopropyl alcohol) which is easily dried to facilitate the drying.

Figure 6:
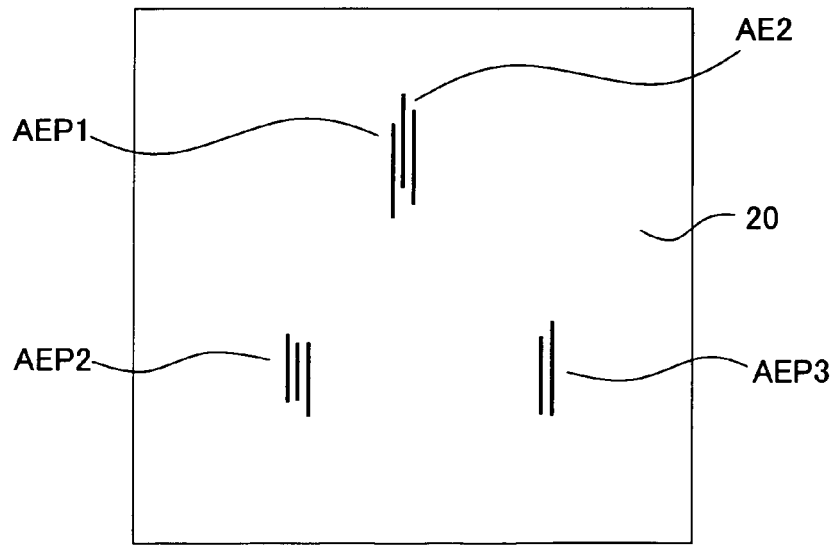
FIG. 6 shows a state in which the active element members AE2 and the like are arranged in a predetermined direction at predetermined positions, respectively, on the process-objective substrate 20.

FIG. 6 shows the process-objective substrate 20 in a state in which the dielectric liquid 12, the unnecessary active element members AE1, AE3 contained therein, and other components are removed after performing the washing step. Areas AEP1, AEP2, AEP3, in which the active element members AE2 and the like are fixed, are formed on the process-objective substrate 20 corresponding to the respective positions and the orientations of the pattern electrodes P1, P2, P3 on the mask 1 shown in FIG. 1 arranged opposite to the process-objective substrate 20 as described above, so that the areas AEP1, AEP2, AEP3 are formed in parallel thereto at the positions corresponding to the pattern electrodes P1, P2, P3, respectively.

The active element members AE2 and the like have properties as semiconductors or satisfactory conductors, but are not provided yet with the function as the active element such as the transistor. Accordingly, it is necessary to perform a step for converting, for example, the active element members AE2 into the active elements and for supplying, for example, signal wirings thereto so as to complete the process-objective substrate 20 as the electronic device.

Figure 7:
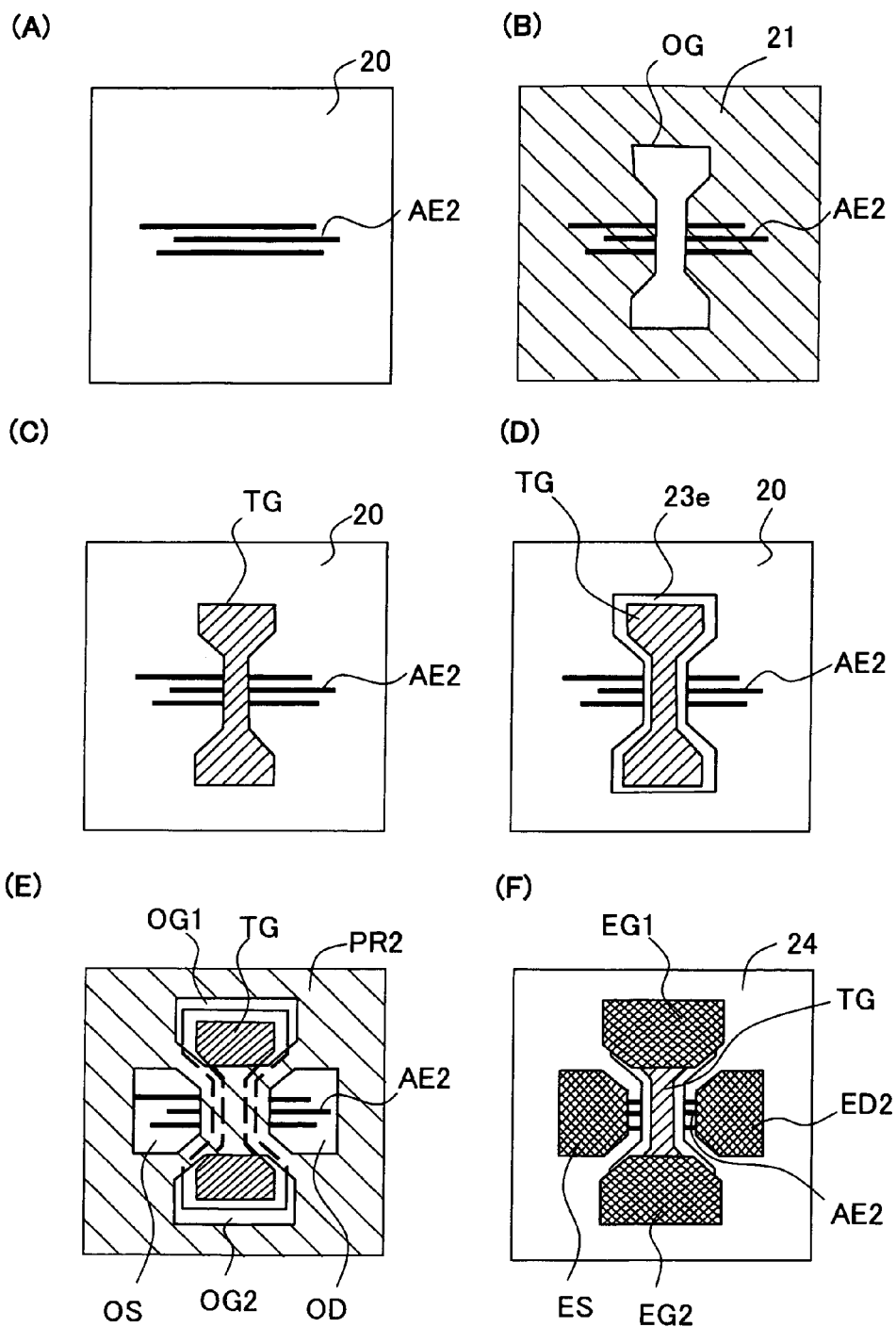
Figure 8:
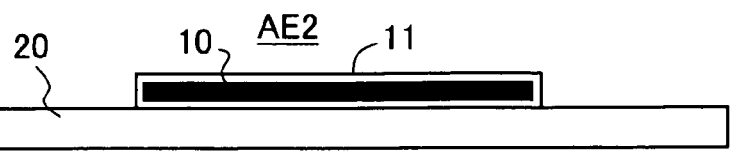
Figure 8:
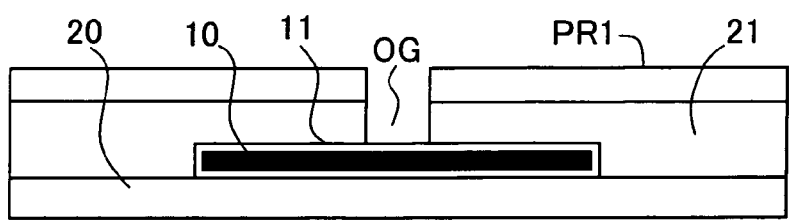
Figure 8:
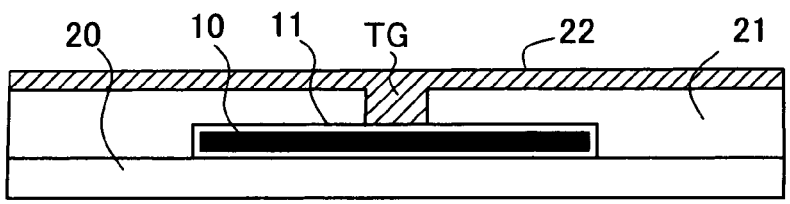
Figure 8:
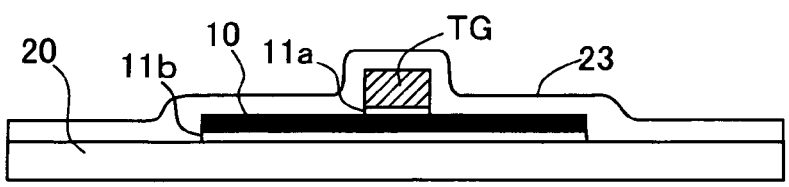
Figure 8:
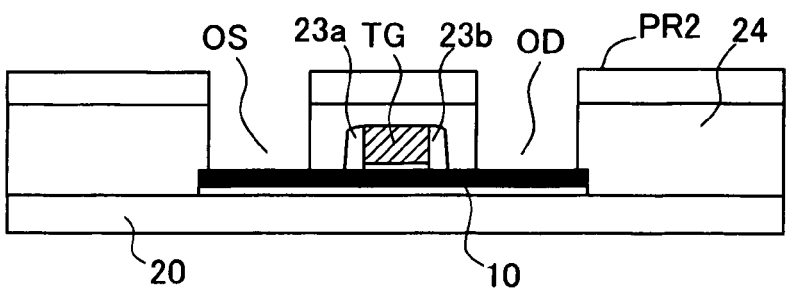
Figure 8:
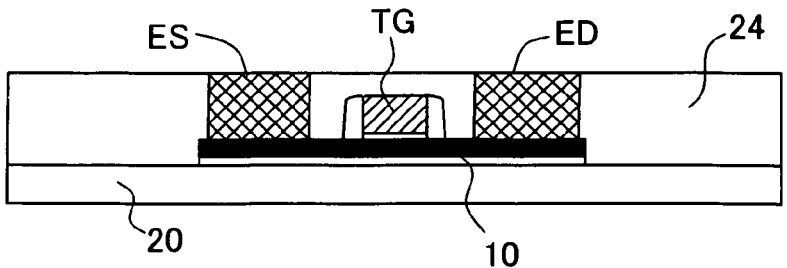

An explanation will be made with reference to FIGS. 7 and 8 about the steps of producing the electronic device. FIG. 7(A) shows a magnified view illustrating those disposed in the vicinity of the area AEP2 on the process-objective substrate 20 shown in FIG. 6, which depicts an arrangement obtained by rotating the arrangement of FIG. 6 by 90 degrees. FIGS. 7(B) to 7(F), shown following FIG. 7(A), depict the process steps of producing the electronic device.

FIGS. 8(A) to 8(F) similarly depict the process steps of producing the electronic device as well, which correspond to FIGS. 7(A) to 7(F). FIGS. 8(A) to 8(F) show sectional views illustrating the process-objective substrate 20 as being sectioned in the longitudinal direction of the active element member AE2.

As shown in FIG. 8(A), the active element member AE2 is firstly in such a state that the insulative thin film 11 is formed around the active element material 10. A sacrificial film 21, which is composed of, for example, an organic material, is formed on the process-objective substrate 20 in this state, and a photoresist PR1 is formed thereon. The photoresist PR1 is exposed with a predetermined pattern by using, for example, an optical exposure apparatus. Development and etching steps are performed to form an opening pattern OG for a gate, wherein the sacrificial film 21 is removed only from the portion corresponding to the gate, as shown in FIGS. 7(B) and 8(B). In this situation, the insulative thin film 11 on the active element member AE2 is not removed.

Subsequently, as shown in FIG. 8(C), a film of a wiring material 22 is uniformly formed on the process-objective substrate 20, wherein the wiring material 22 is composed of, for example, a metal such as aluminum or tungsten, a semiconductor material such as polysilicon, a conductive organic material, or the like. Further, for example, CMP (chemical mechanical polishing), the etch-back process, or the like is used to remove the wiring material 22 other than the wiring material (gate electrode TG) 22 embedded in the portion of the opening pattern OG for the gate. FIG. 7(C) shows a state in which the wiring material 22 is present at only the opening pattern OG for the gate, thereby forming the gate electrode TG.

After that, as shown in FIG. 8(D), an insulating film 23 such as silicon nitride is uniformly formed as a film on the process-objective substrate 20. After that, a greater or substantial part of the insulating film 23 is removed by using the selective etching performed at a position above the insulating film 23. In this situation, the side wall portion of the gate electrode TG has a thickness great in the vertical direction of the insulating film 23. Therefore, as shown in FIG. 7(D), the insulating film 23 partially remains as an insulating film 23e at the side wall portion of the gate electrode TG even after performing the selective etching at the position above the insulating film.

When the etching is performed, the insulative thin film 11 on the active element member AE2 is also removed together. If necessary, a step for injecting impurity is performed for a portion, of the active element member AE2, exposed as shown in FIG. 7(D), i.e., for the portion which is not covered with the insulating film formed on the side wall and the gate electrode TG.

Accordingly, the active element member AE2 can be made as a field effect transistor in which the gate electrode TG is the gate, and portions exposed at the both ends of the gate electrode TG are the source and the drain. When the active element member AE2 is composed of the semiconductor crystal, if necessary, the semiconductor for constructing the semiconductor crystal and the metal can be also made into an alloy by forming the metal, which is composed of cobalt, titanium or the like, uniformly as a film on the process-objective substrate 20 in this state, and by heating the substrate.

In the exemplary embodiment described above, the gate oxide film of the field effect transistor is the insulating film 11 composed of the silicon dioxide film or the organic material having been previously formed around the active element member AE2. However, for example, the selective etching may be performed at a position above with respect to the active element member AE2 in the state shown in FIGS. 7(A) and 8(A) to remove the insulating film 11 formed on the surface so that a newly formed insulating film may be used in place thereof. The new insulating film can be formed, for example, by the thermal oxidation or CVD. This procedure has such a merit that the satisfactory film, which involves less pollution with impurity, can be used as the gate insulating film.

Assuming that the insulating film 11 arranged around the active element member AE2 is removed during the production steps as described above, it is also allowable to use an active element member AE2 which has no insulating film 11, i.e., an active element member AE2 which is made of only the active element material 10. In this procedure, the active element member AE2 is fixed onto the process-objective substrate 20 in accordance with the method as described above, and then the insulating film is formed on the surface of the active element member AE2 as described above.

Subsequently, an insulating film 24, which is composed of an organic material or silicon dioxide, is formed as a film on the process-objective substrate 20 in this state, and a photoresist PR2 is formed thereon. The photoresist PR2 is exposed with a predetermined pattern by using, for example, the optical exposure apparatus again. The development and etching steps are performed to form a source opening pattern OS, a drain opening pattern OD, and two opening patterns OG1, OG2 for the gate connection on the photoresist PR2 and the insulating film 24 as shown in FIGS. 7(E) and 8(E).

Insulating films 23a, 23b shown in FIG. 8(E) correspond to the insulating film 23e allowed to remain on the side wall of the gate electrode TG as shown in FIG. 7(D) as described above. After the photoresist PR2 is exfoliated, a wiring material, which is composed of, for example, aluminum, tungsten, copper, or the like is uniformly formed on the process-objective substrate 20. The wiring material is removed except for portions thereof as wiring material ES, ED, EG1, EG2 embedded in the portions of the respective opening patterns OS, OD, OG1, OG2 by using, for example, CMP (chemical mechanical polishing).

Accordingly, the steps are completed to form the transistor and add electrodes ES, ED, EG1, EG2 thereto. After that, the wiring is formed to mutually join the electrodes ES, ED, EG1, EG2 of the respective transistors formed on the process-objective substrate 20 while providing a predetermined relationship. Accordingly, the electronic device is completed. The steps for forming the signal wiring for the electrodes ES, ED, EG1, EG2 of the respective transistors are the same as the known steps of producing the general semiconductor integrated circuit or the like, any explanation of which is omitted.

The electronic device, which can be produced in accordance with the method for producing the electronic device of the present invention, includes various electronic devices including, for example, memory devices such as DRAM and flash memories, logic devices such as CPU (Central Processing Unit), DSP (Digital Signal Processor), and ASSP (Application Specific Standard Processor), liquid crystal display devices, EL display devices, plasma display devices, and so-called electronic paper based on the use of the deposition function of silver ion. The production steps, which are inherent in the respective electronic devices as described above, are omitted from the explanation, because it is possible to use the known production steps respectively.

The steps of forming the transistor as described above are not necessarily indispensable for the method for producing the electronic device according to the present invention. For example, the method for producing the electronic device of the present invention may include a step for converting, into a diode, the active element member AE2 formed at the predetermined position on the process-objective substrate 20. In the embodiment described above, the step for injecting the impurity into the active element material 10 is performed after the fixation of the active element material 10 onto the process-objective substrate 20. However, the step for injecting the impurity can be also performed before the fixation of the active element material 10 onto the process-objective substrate 20. For example, as for the method for forming the active element material 10, it is possible to adopt a method in which the rod-shaped active element material 10 is allowed to grow from one end to the other end, and it is possible to adopt a method in which the growth is effected while changing the impurity concentration in the formation atmosphere to change the impurity concentration depending on the position in the longitudinal direction of the rod-shaped active element material 10. Accordingly, for example, it is possible to form such an active element material 10 that the central portion is the p-type semiconductor, and the both ends are the n-type semiconductor. When the active element material 10 as described above is used, it is possible to omit the step for injecting the impurity after fixing the rod-shaped active element material onto the process-objective substrate 20.

In the method for producing the electronic device according to the present invention, a metal or a semiconductor may be formed as an electrode on the surface of the active element material 10 to provide a diode by utilizing the rectifying characteristic between the junctions. When the diodes as described above are formed at the both ends of one active element member AE2 respectively, the two diodes are arranged in series in the opposite characteristics. That is, a back-to-back type diode is formed. The back-to-back type diode as described above is usable, for example, as an active element for controlling each of the display elements of the liquid crystal display device.

It is a matter of course that the present invention is not limited to the embodiments described above, which may be embodied in other various forms without deviating from the gist or essential characteristics of the present invention.

INDUSTRIAL APPLICABILITY

According to the present invention, the fine particulate active element member, which has been hitherto difficult to be applied to the electronic device due to the difficulty of the control of the position and the direction, can be applied to the electronic device. It is possible to produce the high performance electronic device based on the use of the fine particulate active element member.

When the active element member containing the carbon nanotube is used, it is possible to produce the integrated circuit which has the higher speed and which consumes the smaller amount of electric power, as compared with the conventional integrated circuit constructed of the transistor made of silicon.

When the active element member containing, for example, the fine particulate powder of the semiconductor crystal is used, it is possible to provide, for example, the high performance display device and the memory device at low cost.

The invention claimed is:

1. A method for producing an electronic device, comprising:
    a step of arranging a mask, having at least one predetermined electrode formed thereon, opposite to a process-objective substrate with a predetermined spacing distance, the predetermined electrode being a composite electrode constructed of a positive electrode which applies a positive electric potential and a negative electrode which applies a negative electric potential, the positive electrode and the negative electrode being arranged adjacently;
    a step of filling a space formed between the process-objective substrate and the mask with a dielectric liquid containing a fine particulate active element member;
    a step of applying a predetermined voltage to the composite electrode;
    a step of fixing the active element member contained in the liquid to the process-objective substrate; and
    a step of removing the mask from the process-objective substrate.

2. The method for producing the electronic device according to claim 1, wherein the active element member is a fine particulate rod-shaped active element material.

3. The method for producing the electronic device according to claim 2, wherein the active element member further includes an insulating material which surrounds the fine particulate rod-shaped active element material.

4. The method for producing the electronic device according to claim 2, wherein the active element material is a carbon nanotube.

5. The method for producing the electronic device according to claim 2, wherein impurity concentration in the fine particulate rod-shaped active element material changes depending on a position in a longitudinal direction of the fine particulate rod-shaped active element material.

6. An electronic device produced by the method for producing the electronic device as defined in claim 5.

7. The method for producing the electronic device according to claim 2, wherein the active element material is a fine particulate rod-shaped semiconductor.

8. The method for producing the electronic device according to claim 7, wherein the fine particulate rod-shaped semiconductor has a central portion which is one of a p-type and a n-type and both end portions each of which is the other of the p-type and the n-type.

9. An electronic device produced by the method for producing the electronic device as defined in claim 8.

10. The method for producing the electronic device according to claim 1, wherein the active element member has a photoreactive substance on an outer circumference thereof.

11. The method for producing the electronic device according to claim 10, wherein the photoreactive substance includes at least one selected from the group consisting of carboxyl group, sulfo group, hydroxyl group, and fluorine.

12. The method for producing the electronic device according to claim 10, wherein the step of fixing the active element member contained in the liquid to the process-objective substrate includes radiating a light beam or an energy ray onto the dielectric liquid and the process-objective substrate.

13. The method for producing the electronic device according to claim 12, wherein the electrode formed on the mask is a transparent electrode which is transparent with respect to the light beam or the energy ray used in the step of fixing the active element member to the process-objective substrate.

14. The method for producing the electronic device according to claim 13, wherein the transparent electrode is formed of one of metal oxide and metal nitride.

15. The method for producing the electronic device according to claim 13, wherein the transparent electrode is formed of a diamond film.

16. The method for producing the electronic device according to claim 1, wherein the process-objective substrate has a photoreactive substance on a surface thereof.

17. The method for producing the electronic device according to claim 16, wherein the photoreactive substance includes at least one selected from the group consisting of carboxyl group, sulfo group, hydroxyl group, and fluorine.

18. The method for producing the electronic device according to claim 1, wherein the electric potential, which is applied to the composite electrode, is an AC electric potential.

19. The method for producing the electronic device according to claim 1, wherein the electric potential, applied to the composite electrode, is an AC electric potential to which a DC offset is applied.

20. The method for producing the electronic device according to claim 1, wherein the composite electrode is constructed of a first electrode which applies a first electric potential and which extends in one direction, and a second electrode which is arranged in parallel to the first electrode on both sides of the first electrode and which applies a second electric potential having a polarity opposite to that of the first electric potential.

21. The method for producing the electronic device according to claim 20, wherein the electric potential, which is applied to the composite electrode, is an AC electric potential.

22. The method for producing the electronic device according to claim 20, wherein the electric potential, applied to the composite electrode, is an AC electric potential to which a DC offset is applied.

23. The method for producing the electronic device according to claim 1, wherein the dielectric liquid contains water as a main component thereof.

24. The method for producing the electronic device according to claim 1, wherein the dielectric liquid contains an organic solvent as a main component thereof.

25. The method for producing the electronic device according to claim 1, further comprising a step of converting the active element member into a transistor.

26. An electronic device produced by the method for producing the electronic device as defined in claim 25.

27. An electronic device produced by the method for producing the electronic device as defined in claim 1.

28. The method for producing the electronic device according to claim 1, wherein the electronic device is a memory device.

29. The method for producing the electronic device according to claim 1, wherein the electronic device is a display device.

* * * * *